Jan. 16, 1968 D. S. GRANBERRY 3,364,400

MICROWAVE TRANSISTOR PACKAGE

Filed Oct. 22, 1964 2 Sheets-Sheet 1

Doyle S. Granberry
INVENTOR.

BY John E. Vandigriff

Jan. 16, 1968 D. S. GRANBERRY 3,364,400

MICROWAVE TRANSISTOR PACKAGE

Filed Oct. 22, 1964 2 Sheets-Sheet 2

Doyle S. Granberry
INVENTOR.

BY John E. Vandigriff 3,364,400

MICROWAVE TRANSISTOR PACKAGE

Doyle Sherwood Granberry, Dallas, Tex., assignor to Texas Instruments Incorporated, Dallas, Tex., a corporation of Delaware Filed Oct. 22, 1964, Ser. No. 405,667
4 Claims. (Cl. 317—235)

In the design of microwave transistors it is necessary that stray inductances and capacitances be kept to a minimum. High collector capacitance between the leads and lead inductance has the serious effect of limiting the frequency at which transistors will operate efficiently. With the advance in the design of transistors, devices have been evolved with relatively low collector capacitance. These devices have been packaged with radial leads, keeping the leads as far apart as possible to reduce capacitance between them. The leads have been placed at right angles, at 180° to each other or, in some instances, at 120° around the device. Flat ribbon-like leads have been used in preference to round ones in order to reduce their inductance.

When such devices are to be used in the microwave regions, the various stray inductances and capacities associated with the leads become even more critical. In microwave filter design work, for example, the stray inductances and capacities of the leads have been utilized in the design of the filter, making use of their stray elements rather than cause them to produce undesired effects.

It is therefore an object of the invention to provide a new and improved transistor package.

Another object of the invention is to provide new and improved transistor packages having high frequency response.

Another object of the invention is to beneficially utilize the stray capacitances and inductances in the design of a microwave transistor package.

Other objects and features of the invention will become more readily understood from the following description when taken in conjunction with the appended claims and attached drawings in which:

FIGURES 1*a* through 1*d* show an exploded view of the header of the present invention illustrating the various parts and regions thereof; FIGURE 1*d* showing the base or "underside" of the device, while FIGURE 1*e* shows the details of the transistor mounted on one of the elements of the header;

Figure 1A:
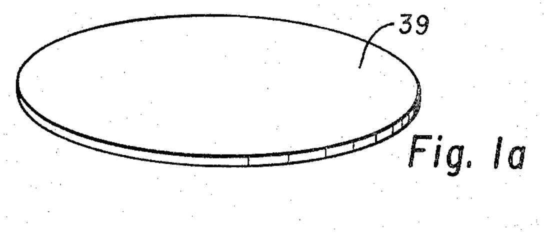
Figure 1B:
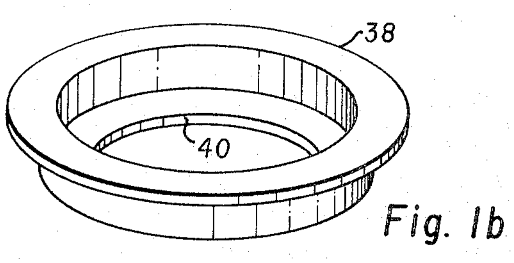

The invention comprises a microwave transistor package which has incorporated into the design as an integral part thereof input and output transmission lines which match the enclosed transistor to a particular characteristic impedance. The design is especially suited to microstrip and stripline circuits. Reference is made to IRE Transaction on Microwave Theory and Techniques, volume MTT–3, March 1955, a special issue on the "Symposium on Microwave Strip Circuits" which is highly informative of the design of such circuits. The package is an example of how the electrical properties of various elements of the package may be selectively combined and utilized to perform microwave circuit functions to increase the range of operations further into the microwave region.

Inductance in a microwave package must be kept to a minimum since the build-up and decay time due to the inductance at microwave frequencies may be even more important than the charge and discharge time due to capacitance. Inductance is especially objectionable in common leads because it changes the input impedance of the device.

In the example illustrated in the drawings and described below, a common emitter circuit is used. However, either common base or common collector may be used merely by changing the interconnections or shifting the location of the transistor wafer.

Figure 1C:
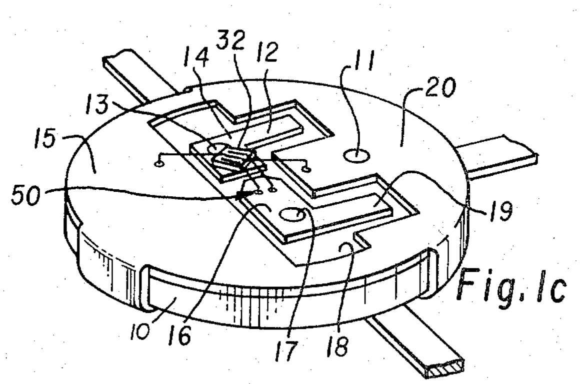

Referring now to FIGURES 1*a*–1*e* and more particularly FIGURE 1*c*, there is shown in the latter figure the side of a ceramic disc 10 upon which the semiconductor wafer 32 is mounted. The disc has metallized portions 15 and 20 and is enclosed by the dish-shaped eyelet 38 shown in FIGURE 1*b* and by the cover lid 39 shown in FIGURE 1*a*. In practice, the rim flange 40 of eyelet 38 is hermetically sealed to the metallized portions 20 and 15 of the disc 10. The metallized portions 15 and 20 enclose an area 18 on the surface of the disc which is left unmetallized to isolate the metallized regions 12–14 and 16–19 formed on the disc 10.

Figure 1D:
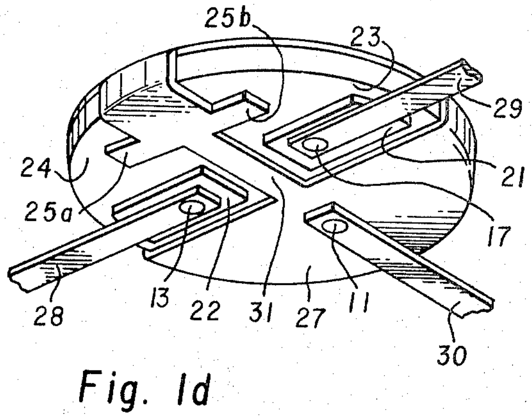

The metallized region 16–19 is connected to the metallized region 21 on the opposite side of the disc (see FIGURE 1*d*) by means of pin 17 which may be a rivet or a portion of the metallizing material which goes through to connect and fill the hole. In like manner, metallized region 12–14 is connected to metallized region 22 on the opposite side of disc 10 by pin 13 which likewise may be a rivet or metallizing material. Lead wires 29 and 28, respectively secured to the underside of disc 10 by pins 17 and 13, are connected through the disc to the respective contact regions 16–19 and 12–14 on the opposite side. Lead 30 is attached to the metallized area 27 as shown in FIGURE 1*d* and is connected to the metallized disc 10 on its opposite side by the pin 11. The metallized areas 15 and 20 on the top side of the disc are electrically connected to the metallized areas 25*a* and 25*b*, 31 and 27, respectively, on the bottom side of the disc through the pin 11 and by metallized material which goes across the rim of the ceramic disc.

Figure 1E:
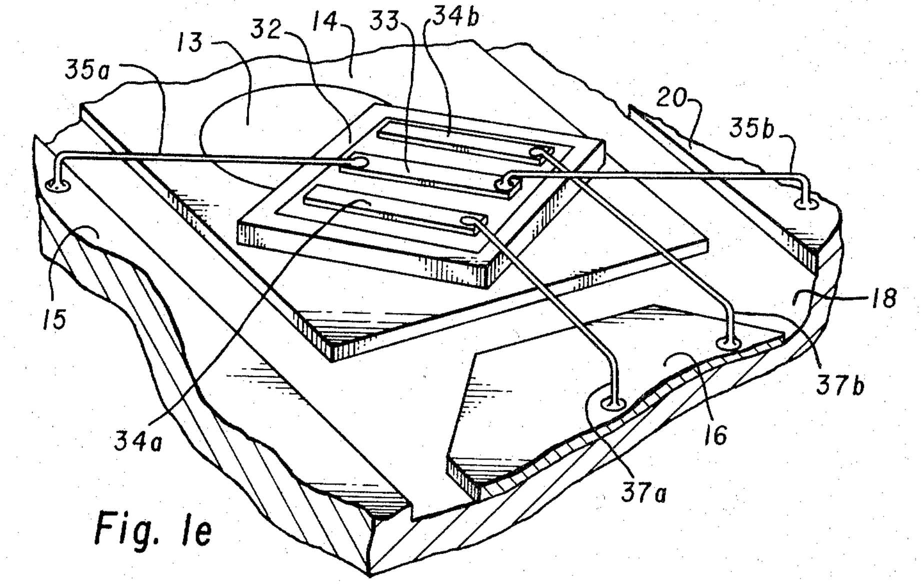

FIGURE 1*e* is an enlarged fragmentary showing of that portion of the top surface of disc 10 shown in FIGURE 1*c* on which the semiconductor device 32 is mounted. Details are shown as to the mounting of the device and its interconnection with the various regions on the ceramic disc. The device is mounted on the portion 14 of the region 12–14. This is the collector connection of the device since the back portion of wafer 32 is in direct contact with and bonded to the metallized region 12–14. The stripes 34*a* and 34*b* are contacts extending to the base region of the device and are further connected to region 16 by interconnecting wires 37*a* and 37*b*. The stripe 33 constitutes the emitter contact of the device and is interconnected with both metallized regions 15 and 20 by leads 35*a* and 35*b*, respectively. It should be observed that both regions 15 and 20 are electrically one and the same. Double connections are used for both the emitter and base regions, as noted, to reduce the inductance caused by these leads. It is also important to note that in the case of the emitter lead, current will be flowing in opposite directions in the two leads 35*a* and 35*b*, thus reducing the overall mutual inductance of the two leads. The metallized regions 19 and 12 (see FIGURE 1*c*) are especially designed and placed in the pattern of the isolated contact regions for specific purposes which will be explained hereinafter.

Figure 2:
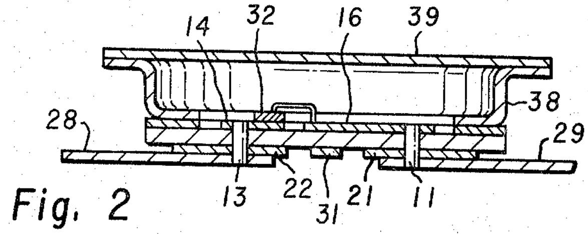
FIGURE 2 shows a cross section of the assembled header.

FIGURE 2 is a cross-section of the assembled device and shows the relationship of the lead wires, metallized regions, ceramic disc and the eyelet and lid enclosure therefor. The lead wires may be bonded in any well known manner to the metallized areas, for example, brazing, the same as the eyelet 38 which is brazed to the metallized portion of the ceramic disc. The lead wires may be made of silver. Since silver is an excellent heat conductor, the leads, if of silver, perform as well the function of a heat sink for the device. Other equally good conductors of heat may be used for leads. The lid 39 may be attached and hermetically sealed to the eyelet 38 in any conventional manner, for instance by resistance welding or thermocompression bonding.

Figure 3:
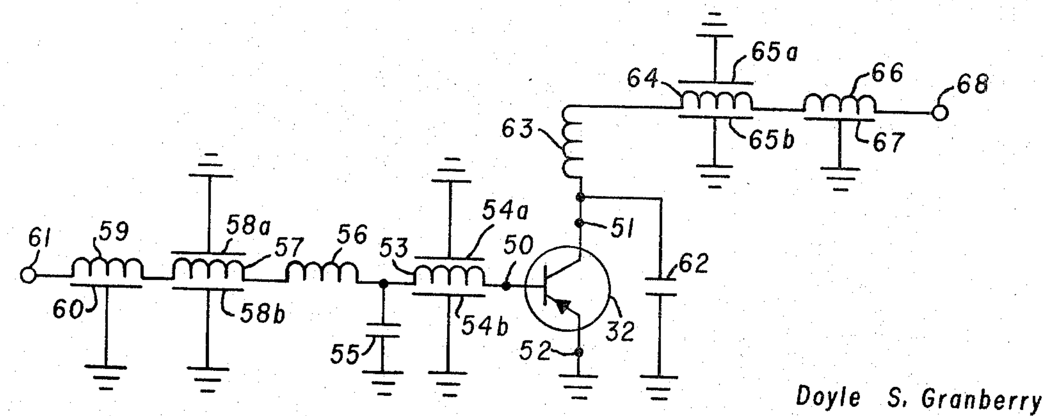
FIGURE 3 is a circuit diagram showing the equivalent circuit of the device and of the header package combined.

FIGURE 3 represents the electrical equivalent of the header structure and transistor 32 mounted therein, as shown in FIGURES 1*a* through 1*e*, and in FIGURE 2. The components in FIGURE 3 represent the various areas on the ceramic disc. Terminal 61 represents the input to lead 29. The inductor 59 and ground plane 60 are represented by the portion of lead 29 up to the metallized region 21, and by the metallized region on the opposite side of the wafer adjacent to the rim at the end of the nonmetallized region 18. The next component is the inductor 57 with the ground planes 58*a* and 58*b* on either side thereof which are represented by the portion of lead 29 lying over the metallized region 21. The inductor 56 is represented by the pin 17 connecting the lead 29 through the disc to the metallized strip portion 16. The capacitor 55 is formed by the metallized portion 19 extending down to the region 20. Inductor 53 between the ground planes 54*a* and 54*b* is formed by the metallized area 16 extending along the nonmetallized region with metallized regions 15 and 20 on either side. Terminal 50 represents a contact to the base of the transistor 32 as represented by wires 37*a* and 37*b*. Emitter contact 33 of the transistor (52 on the circuit FIGURE 3) connects directly to the ground planes 15 and 20 on one side of the wafer and to the metallized regions 25*a* and 25*b*, and 27 on the other side through the pin 11. The collector contact 51 is the back side of the transistor 32 and is connected to metallized region 12 extending down into the slot in the metallized region 20. Inductor 63 is formed by the pin 13 extending through the ceramic disc. Inductor 64 and plane 65*a* and 65*b* are formed similarly to those formed by inductor 57 and planes 58*a* and 58*b* by the portion of lead 28 which overlies metallized area 22. Inductor 66 and ground plane 67 are represented by the remainder of the lead 28 extending out to the edge of the ceramic disc.

In matching the package, the header is divided in two distinct regions to form a transmission line and the device to be matched thereto. An important feature in this built-in method of matching is that the characteristic impedance of the header may be evaluated. This may be accomplished by bridging the gap between the metallized areas 16 and 14 with a 25 mil wide strip with no device mounted on strip 14. If the built-in transmission line is designed to have, for example, a 50 ohm characteristic impedance, the inclusion of this strip will make the 50 ohm characteristic impedance continuous all the way from the base to the collector terminal strip. Tests may then be made for any mismatch in the various regions. Tests such as these may be made for frequencies up to about 7 gc. Excess capacitance may result in the regions represented by the metallized strips 12 and 19 and in the portions of metallized regions 21 and 22 adjacent to the metallized strip 31. Any excess will show up on a VSWR Test and the excess capacitance may be eliminated by painting over some of the silk screen area used in laying down the metallized patterns.

Design changes are very easily accomplished since the patterns to be laid down may be simply varied by using various patterns in a silk screen process by which the metallized areas are made.

Although the invention has been described with reference to a specific example, variations and modifications will become apparent to those skilled in the art without departing from the scope of the invention as defined by the appended claims.

What is claimed is:

1. A packaged microwave transistor comprising:
   (a) a ceramic disc,
   (b) a first metallized region on one surface of said ceramic disc,
   (c) second and third metallized regions on said one surface being electrically isolated from each other and from said first region,
   (d) a fourth metallized region on substantially all of the opposite surface of said ceramic disc having an aperture exposing a portion of said opposite surface of said ceramic disc, said fourth region being ohmically connected to said first region,
   (e) fifth and sixth metallized regions on said portion of said opposite surface of said ceramic disc within said aperature of said fourth region and electrically isolated from each other and from said fourth region, said fifth region being ohmically connected to said second region, said sixth region being ohmically connected to said third region,
   (f) a transistor having its collector region mounted on one of said metallized regions on said opposite surface of said ceramic disc with its base and emitter regions connected respectively to the other metallized regions on said opposite surface of said ceramic disc,
   (g) a metallic eyelet bonded to said fourth region, and
   (h) a metallic disc bonded to said eyelet to form an hermetic package, said first and fourth regions, said metallic eyelet and said metallic disc being ohmically connected together.

2. The package microwave transistor as defined in claim 1, wherein said first region covers a larger area of said one surface than said second and third regions.

3. The packaged microwave transistor as defined in claim 1, wherein said one of said metallized regions on said opposite surface is said fourth metallized region.

4. A packaged microwave transistor as defined in claim 1, wherein said ceramic disc has a plurality of holes therethrough, said fourth region is ohmically connected to said first region through one of said plurality of holes and by a metallized portion across the rim of said ceramic disc, said fifth region is ohmically connected through another of said holes to said second region, and wherein said sixth region is ohmically connected through a third hole to said third region.

References Cited

UNITED STATES PATENTS

| | | | |
|---|---|---|---|
| 2,647,070 | 7/1953 | Litton | 154—43 |
| 3,021,461 | 2/1962 | Oakes et al. | 317—235 |
| 3,136,050 | 6/1964 | Trueb et al. | 317—234 |
| 3,187,083 | 6/1965 | Grimes | 174—50.5 |
| 3,187,240 | 6/1965 | Clark | 317—234 |
| 3,195,026 | 7/1965 | Wegner et al. | 317—234 |
| 3,264,712 | 8/1966 | Hayashi et al. | 29—155.5 |
| 3,271,634 | 9/1966 | Heaton | 317—234 |
| 3,291,578 | 12/1966 | Fahey | 29—195 |
| 3,303,265 | 2/1967 | Noren et al. | 174—52 |
| 3,311,798 | 3/1967 | Gray | 317—234 |

JOHN W. HUCKERT, *Primary Examiner.*

R. F. SANDLER, *Assistant Examiner.*